US012650446B2

(12) United States Patent
Tamura et al.

(10) Patent No.: US 12,650,446 B2
(45) Date of Patent: Jun. 9, 2026

(54) CURRENT SENSOR AND METHOD OF MANUFACTURING INSERT-MOLDED COMPONENT

(71) Applicant: Alps Alpine Co., Ltd., Tokyo (JP)

(72) Inventors: Manabu Tamura, Miyagi-ken (JP);
Junichi Hosogoe, Miyagi-ken (JP);
Keisuke Nakayama, Miyagi-ken (JP)

(73) Assignee: Alps Alpine Co., Ltd., Tokyo (JP)

( * ) Notice: Subject to any disclaimer, the term of this patent is extended or adjusted under 35 U.S.C. 154(b) by 208 days.

(21) Appl. No.: 18/770,062

(22) Filed: Jul. 11, 2024

(65) Prior Publication Data

US 2024/0361358 A1      Oct. 31, 2024

Related U.S. Application Data

(63) Continuation of application No. PCT/JP2023/003082, filed on Jan. 31, 2023.

(30) Foreign Application Priority Data

Mar. 30, 2022      (JP) ................................ 2022-055196

(51) Int. Cl.
G01R 15/18 (2006.01)
B29C 45/14 (2006.01)
(Continued)

(52) U.S. Cl.
CPC ......... G01R 15/18 (2013.01); G01R 19/0092 (2013.01); B29C 45/14065 (2013.01);
(Continued)

(58) Field of Classification Search
CPC .. G01R 15/18; G01R 19/0092; G01R 15/207;
G01R 15/20; B29C 45/14065;
(Continued)

(56) References Cited

U.S. PATENT DOCUMENTS 10,605,835 B2    3/2020  Kawanami et al.
2005/0194845 A1*  9/2005  Engquist ................ H02K 15/10
                                              310/44

(Continued)

FOREIGN PATENT DOCUMENTS

JP          H6-86080          12/1994
JP          2009-083742        4/2009
(Continued)

OTHER PUBLICATIONS

International Search Report from International Application No. PCT/JP2023/003082 dated Jan. 31, 2023 with machine translation.

*Primary Examiner* — Lee E Rodak
*Assistant Examiner* — Zannatul Ferdous
(74) *Attorney, Agent, or Firm* — Beyer Law Group LLP

(57)                ABSTRACT

A current sensor includes a busbar extending in a direction, a magnetic sensor facing the busbar in a direction intersecting the direction in which the busbar extends, a magnetic shield having a base that faces the busbar, at least a portion of the base facing a side of the busbar opposite to a side where the magnetic sensor is disposed, and a case having an insert-molded section in which at least a part of the magnetic shield is insert-molded. The insert-molded section has holes (first holes), and in the holes (first holes), some portions of the magnetic shield are exposed as exposure portions (first exposure portions) and the exposure portions (first exposure portions) have rust-prevention properties. Such a current (Continued)

sensor has the rustproofed exposure portions and thus problems caused by rusting in the exposure portions in the magnetic shield can be prevented or reduced.

15 Claims, 15 Drawing Sheets

(51) Int. Cl.
  B29K 705/00 (2006.01)
  B29L 31/34 (2006.01)
  G01R 19/00 (2006.01)
(52) U.S. Cl.
  CPC .............. *B29C 2045/14122* (2013.01); *B29C 45/14336* (2013.01); *B29K 2705/00* (2013.01); *B29K 2995/0008* (2013.01); *B29L 2031/34* (2013.01)
(58) Field of Classification Search
  CPC .... B29C 45/14336; B29C 2045/14122; B29K 2705/00; B29K 2995/0008; B29L 2031/34
  See application file for complete search history.

(56) References Cited

U.S. PATENT DOCUMENTS

| | | | | |
|---|---|---|---|---|
| 2012/0074613 A1* | 3/2012 | Hellberg | .......... | B29C 45/14426 |
| | | | | 425/129.1 |
| 2017/0242058 A1 | 8/2017 | Kawanami et al. | | |
| 2020/0267841 A1 | 8/2020 | Lee et al. | | |
| 2023/0111157 A1 | 4/2023 | Taoka et al. | | |

FOREIGN PATENT DOCUMENTS

| | | | | |
|---|---|---|---|---|
| JP | 2012-247219 | 12/2012 | | |
| JP | 2014-098633 | 5/2014 | | |
| JP | 2014/202480 | 10/2014 | | |
| JP | 2016-031293 | 3/2016 | | |
| JP | 2017-102022 | 6/2017 | | |
| JP | 2018-119994 | 8/2018 | | |
| JP | 2021-036200 | 3/2021 | | |
| WO | 2014/162687 | 10/2014 | | |
| WO | WO-2014162687 A1 * | 10/2014 | .......... | G01R 15/207 |
| WO | 2018/159229 | 9/2018 | | |
| WO | 2022/024610 | 2/2022 | | |

* cited by examiner

FIG. 10A

CURRENT SENSOR AND METHOD OF MANUFACTURING INSERT-MOLDED COMPONENT

CLAIM OF PRIORITY

This application is a Continuation of International Application No. PCT/JP2023/003082 filed on Jan. 31, 2023, which claims benefit of Japanese Patent Application No. 2022-055196 filed on Mar. 30, 2022. The entire contents of each application noted above are hereby incorporated by reference.

BACKGROUND OF THE INVENTION

1. Field of the Invention

The present invention relates to a current sensor and a method of manufacturing an insert-molded component that is a part of the current sensor, for example.

2. Description of the Related Art

Japanese Unexamined Patent Application Publication No. 2021-36200 discloses a current sensor that includes a plurality of metal busbars, a plurality of magnetic sensors configured to detect induction fields produced by currents flowing through the busbars, a circuit board on which the magnetic sensors are mounted, a case made of synthetic resin that secures the busbars and the circuit board, a cover made of synthetic resin that accommodates the circuit board together with the case, and a magnetic shield provided in the case by insert molding, in which the magnetic shield is rectangular in plan view and has notches at at least one pair of corners on diagonal lines and the case has holes through which edges of the notches of the magnetic shield are exposed.

The shape of the magnetic shield viewed in the direction of current flowing through the busbars may be a plate-like shape as in Japanese Unexamined Patent Application Publication No. 2021-36200 or may be a U-shape as in a current detector disclosed in International Publication No. WO 2018/159229. The U-shaped magnetic shield extends to the sides of the busbar, and thus the magnetic shield may provide more effective shielding.

The current sensor disclosed in Japanese Unexamined Patent Application Publication No. 2021-36200 has the magnetic shield provided in the case by insert molding, enabling accurate control of the positional relationship between the case and the magnetic shield and increased measurement accuracy as the current sensor. The case with the embedded magnetic shield provided by insert molding, however, has holes that are marks made by locating pins used to fix the magnetic shield inside a mold during insert molding, and through the holes, some portions of the magnetic shield are inevitably exposed. The magnetic shield has a soft magnetic material portion, and the portion including the soft magnetic material is typically composed of a metallic material containing an iron-based alloy. The magnetic shield is typically formed by punching, bending, and processing a metal plate of iron-based alloy whose surface is rust-proofed by plating or other processing. Accordingly, portions that have become fracture surfaces in the punching process have not undergone rustproofing treatment. In the portions where the magnetic shield is exposed, at the portions not undergone rustproofing treatment and exposed through the holes, the iron-based alloy material may corrode and rust, and the rust may come off the magnetic shield and spread inside or outside of the case.

Rustproofing treatment can be made separately to the portions of the magnetic shield not rustproofed or the holes may be filled with synthetic resin or by other methods to prevent corrosion. However, such treatments may increase the processing cost and the management cost, which may lead to higher costs.

The present invention provides a current sensor that includes a magnetic-shield-embedded case obtained by insert molding to prevent the above-mentioned problems due to rusting from occurring. In addition, the present invention provides a method of manufacturing an insert-molded component having an inserted member that is less susceptible to rusting.

SUMMARY OF THE INVENTION

A current sensor according to an aspect of the invention to solve the above-mentioned problems include a busbar extending in a direction, a magnetic sensor facing the busbar in a direction intersecting the direction in which the busbar extends, a magnetic shield having a base that faces the busbar, at least a portion of the base facing a side of the busbar opposite to a side where the magnetic sensor is disposed, and a case having an insert-molded section in which at least a part of the magnetic shield is insert-molded. The insert-molded section has holes, and in the holes, some portions of the magnetic shield are exposed as exposure portions and the exposure portions have rust-prevention properties.

Such a current sensor has the rustproofed exposure portions, and thus, even if the metal plates are made of a material susceptible to corrosion, problems that the magnetic shield rusts and the rust comes off and spreads inside or outside of the current sensor can be prevented or reduced. The exposure portions may be rustproofed by inorganic rustproofing treatment such as sacrificial protection plating, organic rustproofing treatment such as resin layers, or by having rustproofed dense areas such as the passivity of stainless steel materials.

In the current sensor, the holes may be, for example, marks of locating pins used for the magnetic shield during insert molding of the insert-molded section.

Here, when it is defined that the direction in which the busbar extends is a first direction, the direction in which the magnetic sensor faces the busbar and orthogonal to the first direction is a third direction, and a direction orthogonal to the first direction and the third direction is a second direction, the magnetic shield in the current sensor may include a bent body of a metal plate having plate surfaces having rust-prevention properties. In this structure, the exposure portions may include first exposure portions of the plate surface facing in the first direction, second exposure portions of the plate surface facing in the second direction, and third exposure portions of the plate surface facing in the third direction.

Such a magnetic shield can use the rust-prevention properties of the metal plate also as rust-prevention properties of the magnetic shield. Accordingly, no special treatment (rustproofing treatment) is necessary to increase the rustproofing properties of the magnetic shield.

In this current sensor, the base may have the plate surface having a normal line extending in the third direction. In such a case, the magnetic shield may include first extending portions each extending in the direction intersecting the first direction from an end of the base in the first direction and having the plate surface having a normal line extending in the first direction, and second extending portions each extending in the third direction from an end of the base in the second direction and having the plate surface having a normal line extending in the second direction. The third exposure portions may be portions of the plate surface of the base, the first exposure portions may be portions of the plate surface of the first extending portions, and the second exposure portions may be portions of the plate surface of the second extending portions.

In such a structure, the side surfaces of the metal plate are not to be exposure portions, and thus the side surfaces may have no special rust-prevention properties, for example, such as fracture surfaces of the metal plate.

In this current sensor, at least the base in the magnetic shield may comprise a multi-layered body including metal plates. In such a case, at least one of the metal plates of the multi-layered body may have the first extending portions or the second extending portions.

In this current sensor, one metal plate of the metal plates, the one metal plate being a layer on one end side in a layered direction of the multi-layered body, may have the first extending portions or the second extending portions, and the first extending portions or the second extending portions may extend toward the other end side in the layered direction of the multi-layered body.

In this current sensor, at least either extended end portions of the first extending portions or extended end portions of the second extending portions may have bent extending portions bent to face the plate surface of the base.

In this current sensor, at least part of the exposure portions may be the plate surface of the bent extending portions.

In this current sensor, the magnetic shield may have two side wall portions that are both ends of the base in the second direction and are bent and extend in the third direction. Specific examples of the case include a case in which the magnetic shield has a U-shape when viewed in the first direction.

In such a current sensor that has the side wall portions, the first extending portions may be provided to the side wall portions.

In this current sensor, the magnetic shield may have two second extending portions that are bent both ends of the base in the second direction and face in the second direction, and the magnetic sensor may be disposed between the two second extending portions when viewed in the third direction.

According to another aspect of the present invention, a method of manufacturing an insert-molded component by placing a component (for example, a magnetic shield) to be embedded provided by punching a metal plate having a rustproofed plate surface inside a mold, and supplying a resin material in the mold is provided. When it is defined that a first direction, a second direction, and a third direction are orthogonal to each other, in this manufacturing method, the component to be embedded has first portions of the plate surface facing in the first direction, second portions of the plate surface facing in the second direction, and third portions of the plate surface facing in the third direction, and in the mold, in a state in which the first portions to the third portions are in contact with corresponding locating pins for locating the component to be embedded, injection molding is performed.

In this manufacturing method, the component to be embedded may include a base having the plate surface having a normal line extending in the third direction, first extending portions each extending in the direction intersecting the first direction from an end of the base in the first direction and having the plate surface having a normal line extending in the first direction, and second extending portions each extending in the third direction from an end of the base in the second direction and having the plate surface having a normal line extending in the second direction. In such a case, the first portions may be provided to the first extending portions, the second portions may be provided to the second extending portions, and the third extending portions may be provided to the base.

In this manufacturing method, at least either extended end portions of the first extending portions or extended end portions of the second extending portions may have bent extending portions bent to face the plate surface of the base. In such a case, at least one of the first portions to the third portions may be provided to the bent extending portions.

According to the embodiments of the present invention, a current sensor that includes a magnetic-shield-embedded case configured to prevent the problems due to rusting in holes remaining as marks of locating pins from occurring is provided. In addition, according to the embodiments of the present invention, a method of manufacturing an insert-molded component for preventing the problems due to rusting in holes remaining as marks of locating pins from occurring is provided.

BRIEF DESCRIPTION OF THE DRAWINGS

FIG. 10A is a view (sectional view taken along line XA-XA) illustrating shielding effects of the magnetic shield in the current sensor according to the fourth embodiment of the present invention;

DESCRIPTION OF THE PREFERRED EMBODIMENTS

Figure 1A:
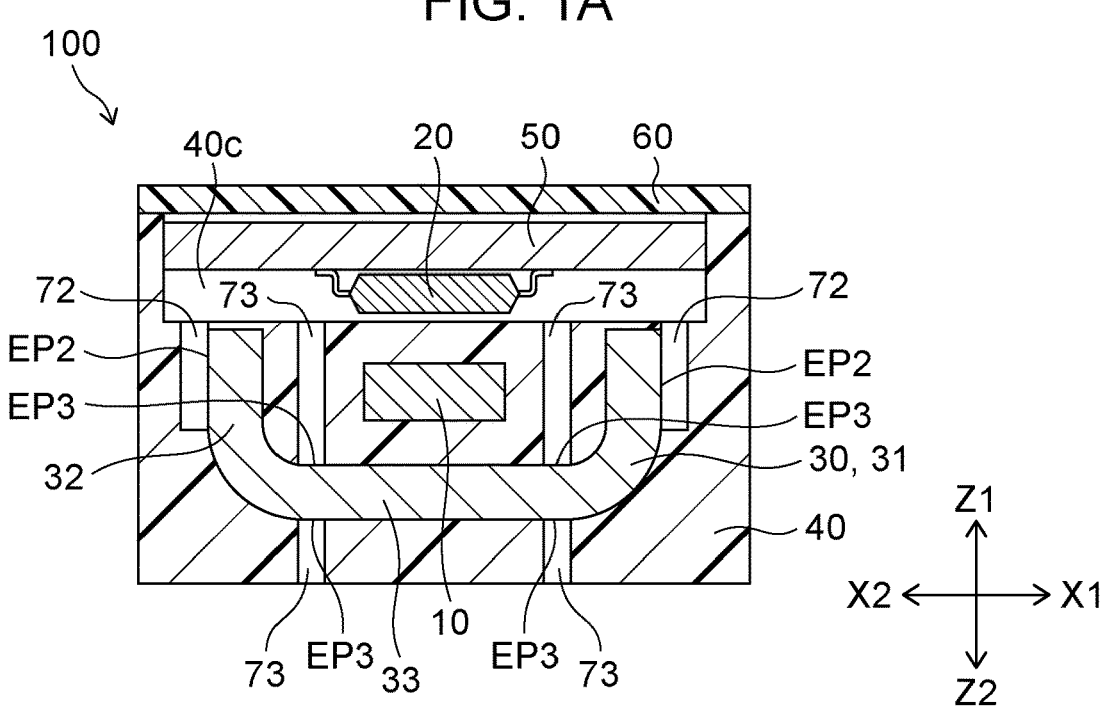
FIG. 1A is a sectional view of a current sensor according to a first embodiment of the present invention taken along line IA-IA.

Hereinafter, embodiments of the present invention will be described with reference to the drawings. In the following description, the same reference numerals are given to the same or similar components and description of the components, for example, described once will be omitted as appropriate. In the following description, the Y1-Y2 direction is defined as the first direction, the X1-X2 direction is defined as the second direction, and the Z1-Z2 direction is defined as the third direction. It should be noted that the Z1 side in the Z1-Z2 direction (third direction) may be referred to as "top", the Z2 side in the Z1-Z2 direction (third direction) may be referred to as "bottom", and directions in the in-plane directions of the X-Y plane may be referred to as "sides".

First Embodiment

Figure 1B:
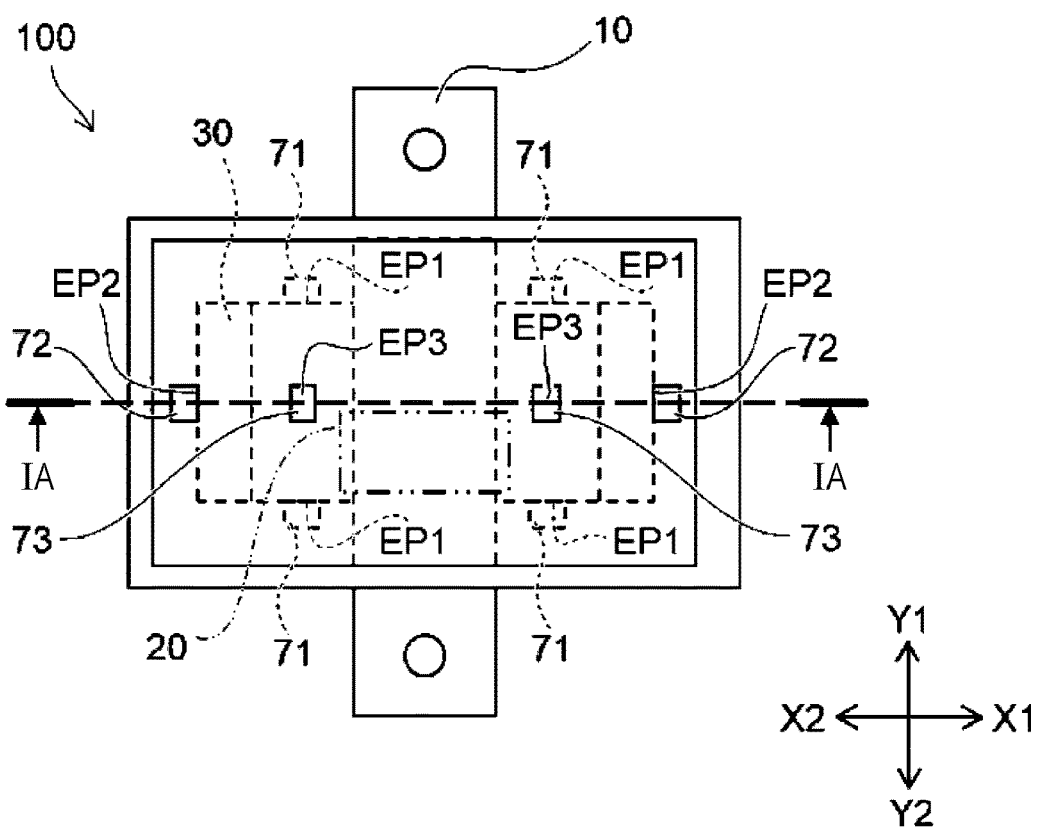
FIG. 1B illustrates the current sensor according to the first embodiment of the present invention.

FIG. 1A is a sectional view of a current sensor according to a first embodiment of the present invention taken along line IA-IA. FIG. 1B illustrates the current sensor according to the first embodiment of the present invention. In FIG. 1B, the magnetic sensor is indicated by a virtual line and a cover and a board are not illustrated for the sake of illustration.

As illustrated in FIG. 1A and FIG. 1B, a current sensor 100 according to the first embodiment of the invention includes a busbar 10, a magnetic sensor 20, a magnetic shield 30, and a case 40. The busbar 10 extends in the first direction (Y1-Y2 direction), and a measurement current flows through the busbar 10. The magnetic sensor 20 that has a sensitivity axis in the second direction (X1-X2 direction) faces the busbar 10 in the third direction (Z1-Z2 direction) that intersects (in this embodiment, is orthogonal to) the first direction (Y1-Y2 direction). More specifically, the magnetic sensor 20 is disposed to face the Z1 side of the busbar 10 in the Z1-Z2 direction.

The magnetic shield 30 has a base 31 that faces the busbar 10. At least a portion of the base 31 faces the side (the Z2 side in the Z1-Z2 direction) of the busbar 10 that is opposite to the side (the Z1 side in Z1-Z2 direction) where the magnetic sensor 20 is disposed. In this embodiment, the entirety of the magnetic shield 30 is the base 31. The magnetic shield 30 has two side wall portions 32 that are both ends of the base 31 of a metal plate in the second direction (X1-X2 direction) bent and extend in the third direction (Z1-Z2 direction). The magnetic shield 30 has a U shape when viewed in the first direction (Y1-Y2 direction). The two side wall portions 32 extend on the Z1 side in the Z1-Z2 direction toward the side (X1-X2 direction) of the magnetic sensor 20 and are connected by a bottom wall portion 33 at the end portions on the Z2 side in the Z1-Z2 direction. The bottom wall portion 33 that is a part of the base 31 faces the busbar 10 in the third direction (Z1-Z2 direction).

Figure 2:
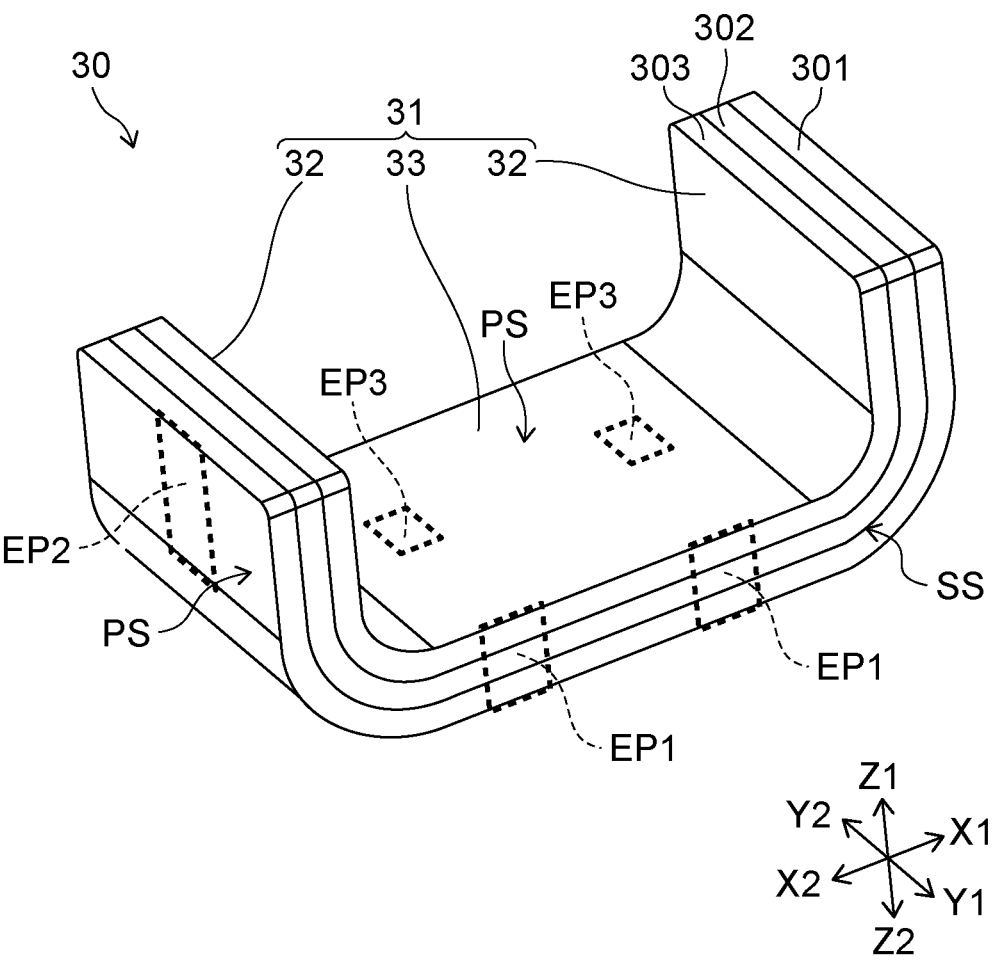
FIG. 2 illustrates a magnetic shield in the current sensor according to the first embodiment of the present invention.

The magnetic shield 30 has a bent body of the metal plate having soft magnetic properties. As illustrated in FIG. 2, in this embodiment, the magnetic shield 30 has a bent body comprising three metal plates 301, 302, and 303, which are stacked and integrated as a whole in the Z1-Z2 direction. The magnetic shield 30 attenuates an external magnetic field directed to the magnetic sensor 20 from the side of the magnetic shield 30 opposite to the side facing the magnetic sensor 20, thereby increasing the measurement accuracy of the magnetic sensor 20 for detecting an induction field produced by the busbar 10. Since the magnetic shield 30 has the U-shaped cross section and the side wall portions 32 extend on the Z1 side in the Z1-Z2 direction toward the sides (X1-X2 direction) of the magnetic sensor 20, not only an external magnetic field coming from the Z2 side of the bottom wall portion 33 in the Z1-Z2 direction but also external magnetic fields coming from the sides (the X1 side in the X1-X2 direction, the X2 side in the X1-X2 direction) of the side wall portions 32 can be attenuated. In addition, the magnetic shield 30 can also function as a yoke for an induction field coming from the busbar 10. Accordingly, an induction field coming from the busbar 10 preferentially flows through the inside of the magnetic shield 30 and is released from the upper (the Z2 side in Z1-Z2 direction) end portions of the side wall portions 32, and thereby the induction field coming from the busbar 10 is effectively applied to the magnetic sensor 20.

The case 40 has an insert-molded section in which at least part of the magnetic shield 30 is insert-molded. In this embodiment, the entire magnetic shield 30 is insert-molded in the case 40, and the entire case 40 is formed by insert molding. Accordingly, the entire case 40 is an insert-molded section. As illustrated in FIG. 1A, part of the busbar 10 is also insert-molded in the case 40.

A mold for integrating the case 40 with the magnetic shield 30 and the busbar 10 by insert molding has locating pins for locating the magnetic shield 30 at a predetermined position in the mold. The locating pins protrude into the space in the mold, which is to be filled with a molding resin during molding processing, to locate the magnetic shield 30. Accordingly, the areas where the locating pins exist are not filled with the molding resin, and the case 40 (insert-molded section) thus has a plurality of holes that remain as marks of the locating pins used for locating the magnetic shield 30 during insert molding. More specifically, the case 40 has first hole portions 71 that are holes each having a hollow extending in the Z1-Z2 direction and an opening on the Z2 side in the Z1-Z2 direction. The first hole portions 71 remain as marks of the locating pins used to come into contact with side surfaces SS (a surface on the Y1 side in the Y1-Y2 direction, a surface on the Y2 side in the Y1-Y2 direction) of the bottom wall portion 33 of the magnetic shield 30 located inside the case 40 to locate the magnetic shield 30 in the Y1-Y2 direction. In the first hole portions 71, some portions of the side surfaces SS (the surface on the Y1 side in the Y1-Y2 direction, the surface on the Y2 side in the Y1-Y2 direction) of the bottom wall portion 33 of the magnetic shield 30 are exposed as first exposure portions EP1. In this embodiment, the first exposure portions EP1 are the side surfaces SS of the side wall portion 32 facing in the first direction (Y1-Y2 direction).

The case 40 has second hole portions 72 that are holes each having a hollow extending in the Z1-Z2 direction and an opening on the Z1 side in the Z1-Z2 direction. The second hole portions 72 remain as marks of the locating pins used to come into contact with the outsides (the X1 side in the X1-X2 direction, the X2 side in the X1-X2 direction) of the side wall portions 32 of the magnetic shield 30 located inside the case 40 to locate the magnetic shield 30 in the X1-X2 direction. In the second hole portions 72, some portions of the side wall portions 32 of the magnetic shield 30 are exposed as second exposure portions EP2. In this embodiment, the second exposure portions EP2 are plate surfaces PS facing in the second direction (X1-X2 direction).

The case 40 has third hole portions 73 that are holes extending in the Z1-Z2 direction and face a top surface (a surface on the Z1 side in the Z1-Z2 direction) of the bottom wall portion 33 of the magnetic shield 30 located inside the case 40. In the interior (bottom portion) of the third hole portions 73, some portions of the top surface (the surface on the Z1 side in the Z1-Z2 direction) of the bottom wall portion 33 of the magnetic shield 30 are exposed as third exposure portions EP3. Some other third hole portions 73 are provided to face a bottom surface (a surface on the Z2 side in the Z1-Z2 direction) of the bottom wall portion 33 of the magnetic shield 30 located inside the case 40. In the interior (top portion) of the third hole portions 73, some portions of the bottom surface (the surface on the Z2 side in the Z1-Z2 direction) of the bottom wall portion 33 of the magnetic shield 30 are exposed as third exposure portions EP3. In this embodiment, the third exposure portions EP3 are the plate surfaces PS facing in the third direction (Z1-Z2 direction).

The case 40 has a cavity section 40c on the upper side (the Z1 side in the Z1-Z2 direction), and the magnetic sensor 20 is disposed in the cavity section 40c in a state in which the magnetic sensor 20 is attached to a board 50. A cover 60 is disposed above (the Z1 side in the Z1-Z2 direction) the board 50, defining the cavity section 40c to be a closed space.

FIG. 2 illustrates the magnetic shield in the current sensor according to the first embodiment of the present invention. As illustrated in FIG. 2, the magnetic shield 30 is formed by bending in a U-shape a multi-layered body including three metal plates 301, 302, and 303 having soft magnetic properties. It should be noted that the multi-layered body may be formed by stacking three U-shaped bent metal plates 301, 302, and 303. In the metal plates 301, 302, and 303, which constitute the multi-layered body, the plate surfaces PS are rustproofed with a film such as an organic-inorganic mixed film and have rust-prevention properties, whereas the side surfaces SS are not rustproofed and do not have rust-prevention properties. In forming the three metal plates 301, 302, and 303, a plate having rust-proofed plate surfaces on both sides is punched to form a rectangular material member elongated in one direction (X1-X2 direction). Accordingly, the portions of the side surfaces SS of the metal plates 301, 302, and 303 have become fracture surfaces in the punching process and are not rustproofed. In this embodiment, accordingly, the fracture surfaces of the metal plates 301, 302, and 303 or the side surfaces SS of the magnetic shield 30 are subjected to rustproofing treatment by a method such as secondary plating. The rustproofing processing may be applied only to portions to be the first exposure portions EP1 or applied throughout the plates including the portions to be the first exposure portions EP1.

As described above, the side surfaces SS corresponding to the first exposure portions EP1 are rustproofed and have rust prevention properties. Accordingly, rusting in the first exposure portions EP1 and spreading of the rust outside the current sensor 100 through the first holes 71 can be prevented or reduced. It should be noted that the type of rustproofing treatment is not particularly limited. Examples of the rustproofing treatment include inorganic rustproofing treatment such as zinc plating and silica coating, organic rustproofing treatment such as polyvinyl alcohol coating, and combined rustproofing treatment for forming an organic-inorganic mixed film or the like.

In the second exposure portions EP2 and the third exposure portions EP3, the plate surfaces PS having rust-prevention properties are exposed and accordingly, special rustproofing treatment as in the first exposure portions EP1 is not necessary.

Second Embodiment

Figure 3A:
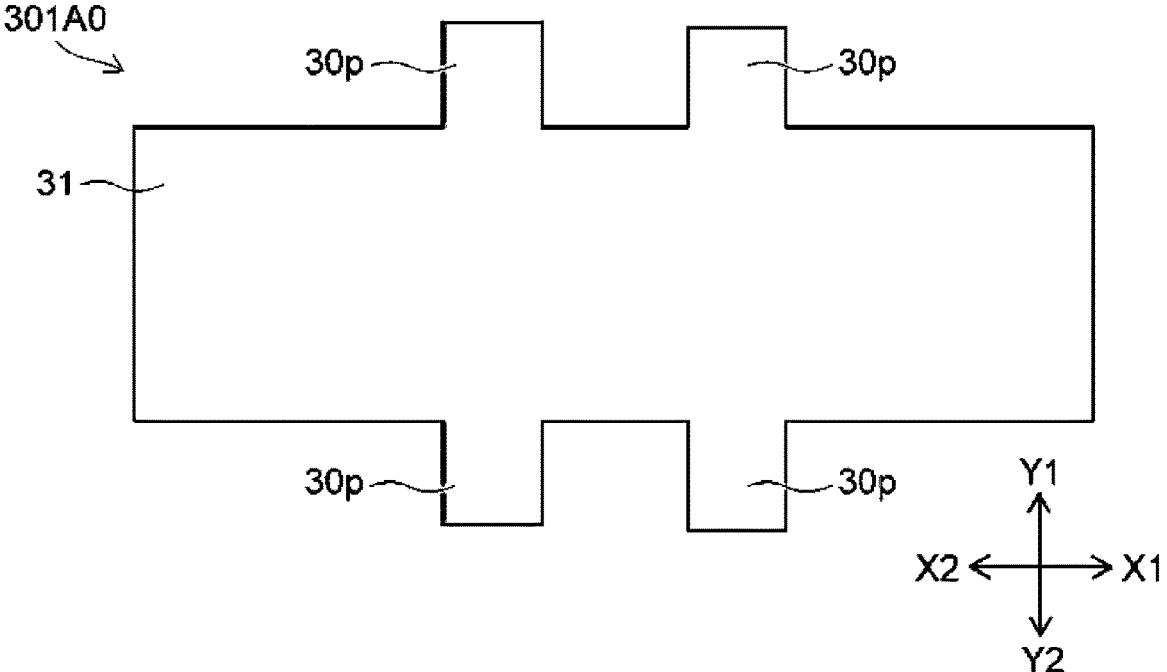
FIG. 3A illustrates a material member of a magnetic shield in a current sensor according to a second embodiment of the present invention.
Figure 3B:
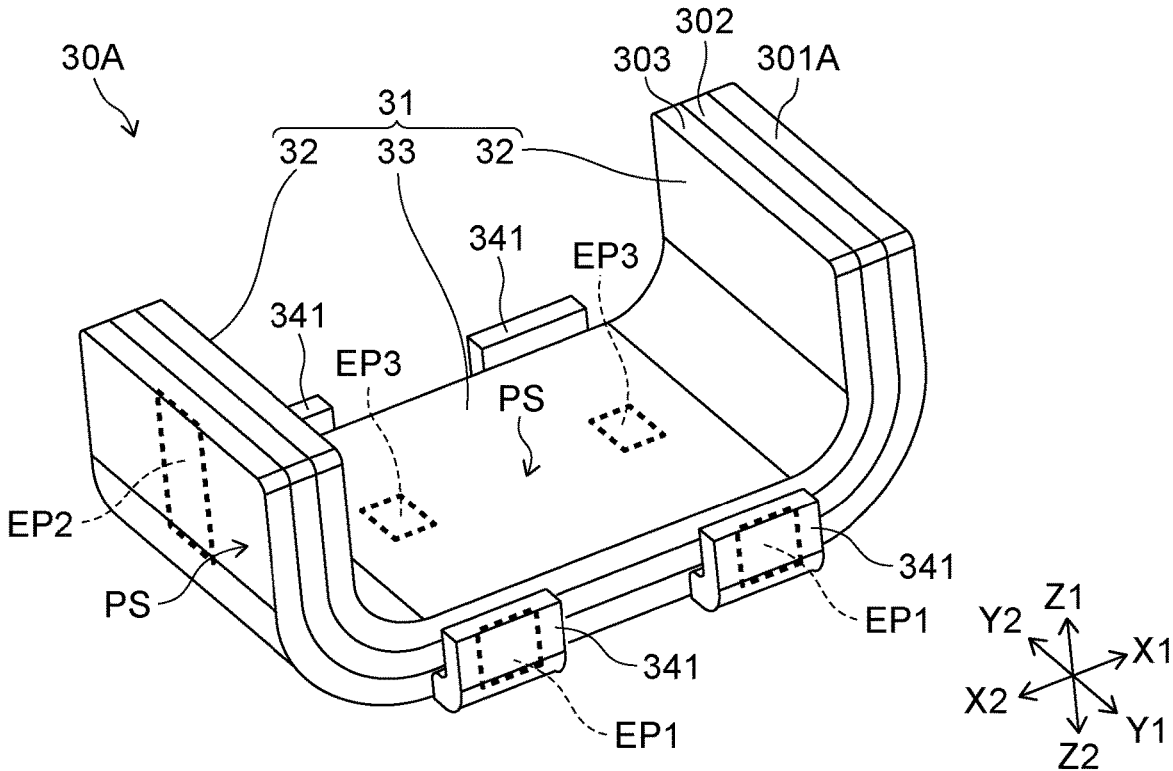
FIG. 3B illustrates the magnetic shield in the current sensor according to the second embodiment of the present invention.
Figures 4A, 4B:
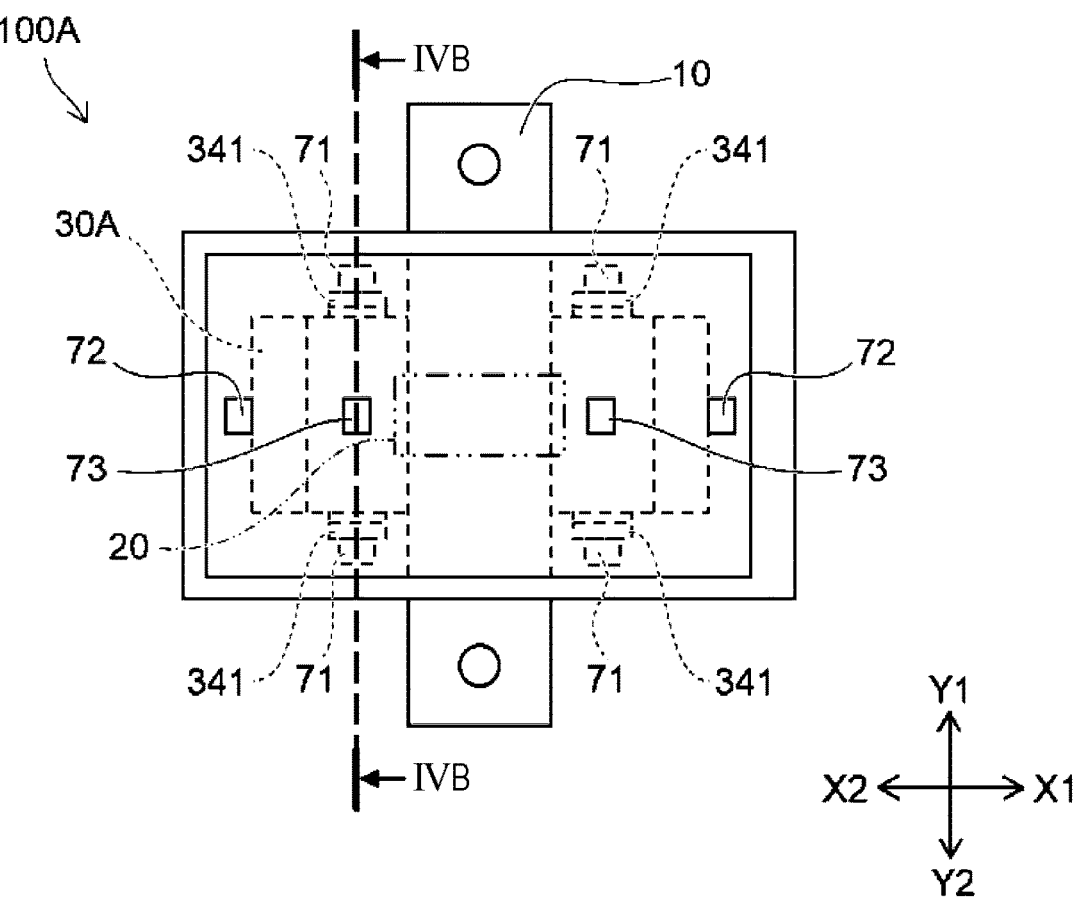
FIG. 4A illustrates the current sensor according to the second embodiment of the present invention.
FIG. 4B is a sectional view of the current sensor according to the second embodiment of the present invention taken along line IVB-IVB.

FIG. 3A illustrates a material member of a magnetic shield in a current sensor according to a second embodiment of the present invention. FIG. 3B illustrates the magnetic shield in the current sensor according to the second embodiment of the present invention. FIG. 4A illustrates the current sensor according to the second embodiment of the present invention. FIG. 4B is a sectional view of the current sensor according to the second embodiment of the present invention taken along line IVB-IVB.

Since the basic structure of a current sensor 100A according to the second embodiment of the present invention is similar to that of the current sensor 100 according to the first embodiment, only differences will be described and description of similar points will be omitted.

The current sensor 100A according to the second embodiment is different from the current sensor 100 according to the first embodiment in that a magnetic shield 30A has a different structure. More specifically, the magnetic shield 30A has first extending portions 341, which will be described below.

As illustrated in FIG. 3A, among three metal plates of a multi-layered body of the magnetic shield 30A, a material member 301A0 that provides an outermost metal plate 301A has a rustproofed plate surface PS similarly to material members of the other metal plates and has a basic rectangular shape elongated in one direction (X1-X2 direction). The material member 301A0 also has four protrusions 30p that protrude from portions of the base 31 in a direction (in this embodiment, the Y1-Y2 direction) intersecting the extending direction (X1-X2 direction) of the material member 301A0.

By bending the protrusions 30p, as illustrated in FIG. 3B, the first extending portions 341 extending from ends of the base 31 (specifically, the bottom wall portion 33) in the first direction (Y1-Y2 direction) are formed to extend in a direction orthogonal to the first direction, that is, in the third direction (Z1-Z2 direction) in this embodiment. Accordingly, the magnetic shield 30A according to the embodiment has the first extending portions 341 each having the plate surface PS that has a normal line extending in the first direction.

The first exposure portions EP1 are the plate surface PS of the first extending portions 341. Accordingly, since the first exposure portions EP1 have the plate surface PS that has already had rust-prevention properties at the stage of the material member 301A0, it is not necessary to apply special rustproofing treatment to the first exposure portions EP1 as in the magnetic shield 30 in the current sensor 100 according to the first embodiment. In a case in which the material member 301A0 is a punched metal plate, the side surfaces SS are fracture surfaces and do not have rust-prevention properties. In such a case, however, different from the first embodiment, the side surfaces SS have no exposure portion and thus any special rustproofing treatment is not required.

In this embodiment, as described above, the metal plate 301A, which is the layer at one end side (the Z2 side in the Z1-Z2 direction) in the layered direction of the multi-layered body (third direction), has the first extending portions 341, and the first extending portions 341 extend toward the other end side (the Z1 side in the Z1-Z2 direction) in the layered direction of the multi-layered body (third direction).

The portions of the side wall portions 32 in the metal plate 301A extend in the third direction (Z1-Z2 direction) from the ends of the base 31 in the second direction (X1-X2 direction) and have the plate surfaces PS having the normal lines extending in the second direction (X1-X2 direction). Accordingly, when the side wall portions 32 are compared with the first extending portions 341, the ends of the base 31 from which the side wall portions 32 and the first extending portions 341 extend are different; however, the side wall portions 32 and the first extending portions 341 are similar in that both the side wall portions 32 and the first extending portions 341 extend in the third direction and have the plate surfaces PS facing in the predetermined directions. Here, when the portions having the plate surface PS extending in the third direction (Z1-Z2 direction) from the ends of the base 31 in the second direction (X1-X2 direction) and having the normal lines extending in the second direction (X1-X2 direction) are defined as second extending portions, the side wall portions 32 can be considered to be the second extending portions.

In accordance with the above definition, the metal plate 301A has the first extending portions 341 and the second extending portions (side wall portions 32). As described above, the metal plate 301A on one end side of the multi-layered body has the extending portions having different normal lines, and therefore this structure can increase the ease of assembly of the multi-layered body.

Figure 5:
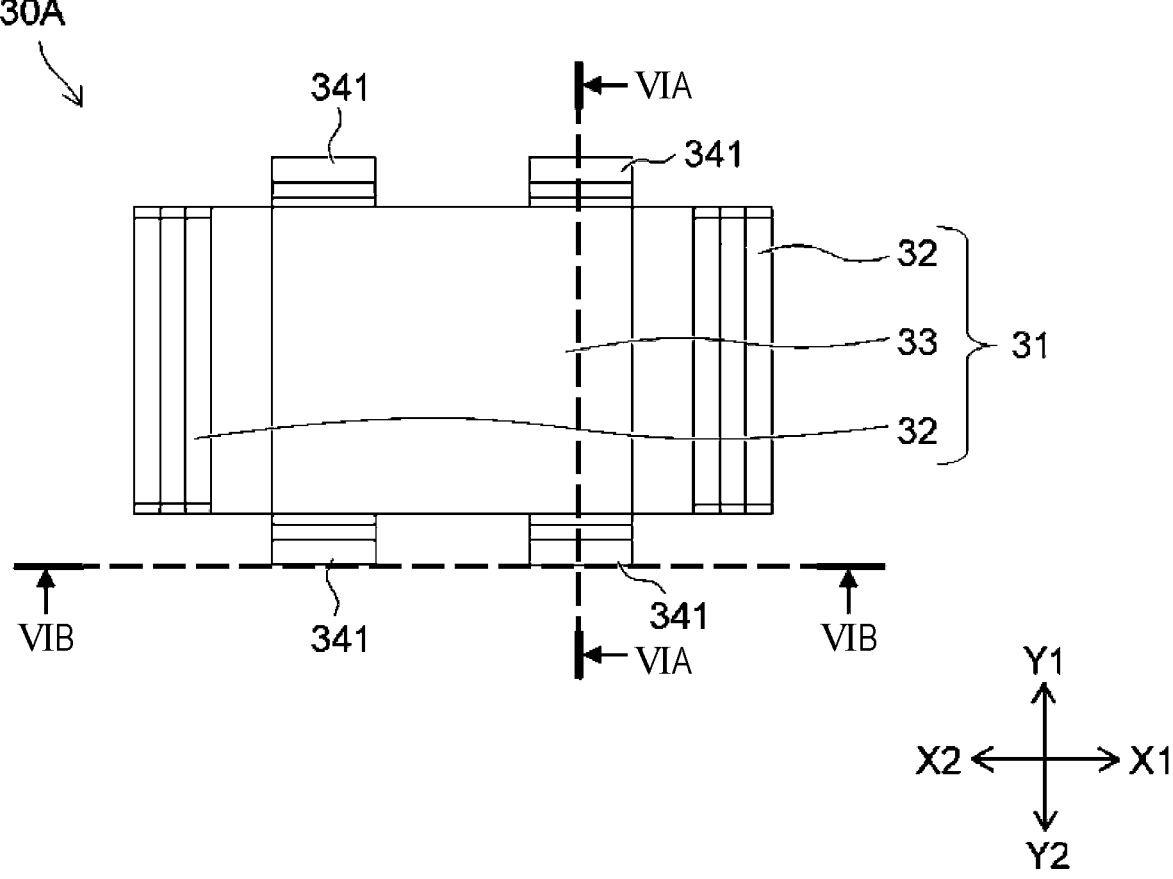
FIG. 5 illustrates a method of forming a case by insert molding, the case being provided in the current sensor according to the second embodiment of the present invention, and is a top view illustrating the magnetic shield formed by insert molding.
Figure 6A:
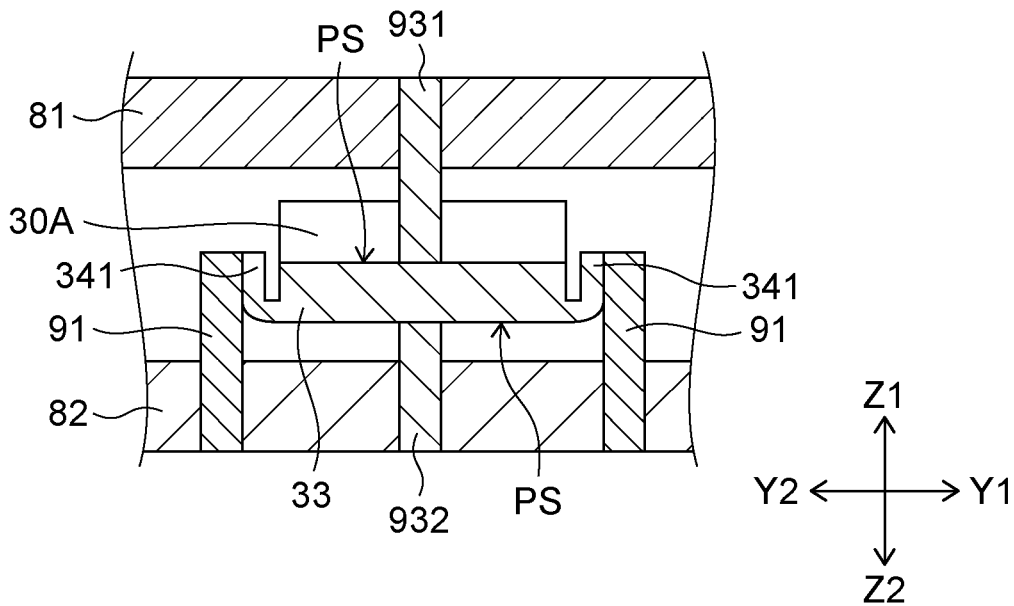
FIG. 6A illustrates a method of forming the case by insert molding, the case being provided in the current sensor according to the second embodiment of the present invention, and is a sectional view taken along line VIA-VIA illustrating the magnetic shield disposed in a mold.
Figure 6B:
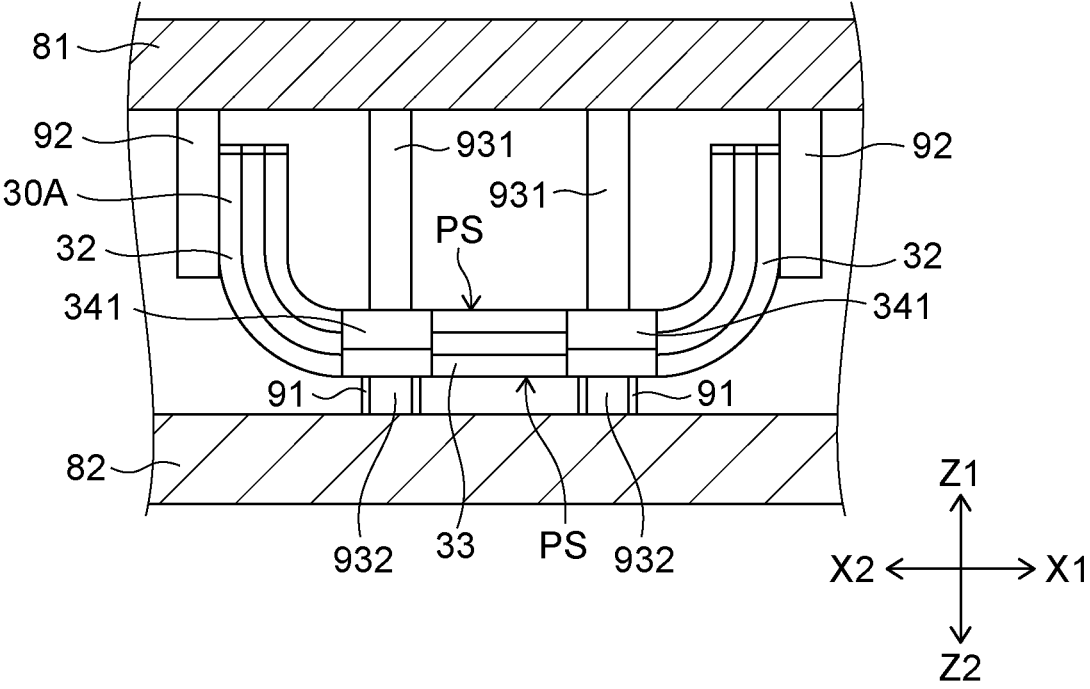
FIG. 6B illustrates a method of forming the case by insert molding, the case being provided in the current sensor according to the second embodiment of the present invention, and is a sectional view taken along line VIB-VIB illustrating the magnetic shield disposed in the mold.

FIG. 5 illustrates a method of forming a case by insert molding, the case being provided in the current sensor according to the second embodiment of the present invention, and is a top view illustrating the magnetic shield formed by insert molding. FIG. 6A illustrates a method of forming the case by insert molding, the case being provided in the current sensor according to the second embodiment of the present invention, and is a sectional view taken along line VIA-VIA in FIG. 5 illustrating the magnetic shield disposed in a mold. FIG. 6B illustrates a method of forming the case by insert molding, the case being provided in the current sensor according to the second embodiment of the present invention, and is a sectional view taken along line VIB-VIB in FIG. 5 illustrating the magnetic shield disposed in the mold.

As illustrated in FIG. 6A and FIG. 6B, the magnetic shield 30A is located by locating pins in a cavity defined by an upper mold 81 and a lower mold 82 of a mold. More specifically, the magnetic shield 30A is positioned in the Z1-Z2 direction (third direction) by locating pins 931, which extend from the upper mold 81 and are located on an upper side (the Z1 side in the Z1-Z2 direction) of the magnetic shield 30A, and locating pins 932, which extend from the lower mold 82 and are located on a lower side (the Z2 side in the Z1-Z2 direction) of the magnetic shield 30A. The locating pins 931 and the locating pins 932 come into contact with the plate surfaces PS of the magnetic shield 30A to hold the bottom wall portion 33. The magnetic shield 30A is positioned in the Y1-Y2 direction (first direction) by locating pins 91 that extend from the lower mold 82 and are located at positions in the Y1-Y2 direction of the magnetic shield 30A. The locating pins 91 come into contact with the plate surface PS of the first extending portions 341, thereby locating the magnetic shield 30A. The magnetic shield 30A is positioned in the X1-X2 direction (second direction) by locating pins 92 that extend from the upper mold 81 and are located on the outside of the magnetic shield 30A in the X1-X2 direction. The locating pins 92 come into contact with the outer walls of the plate surfaces PS of the side wall portions 32, thereby locating the magnetic shield 30A. In this embodiment, the locating pins 91 are provided to the lower mold 82 and the locating pins 92 are provided to the upper mold 81; however, it is not limited to this example, and the locating pins 91 may be provided to the upper mold 81 and the locating pins 92 may be provided to the lower mold 82, or both of the locating pins 91 and the locating pins 92 may be provided to either the upper mold 81 or the lower mold 82. For example, if the locating pins 91 and 92 are provided to the lower mold 82, holes, which remain on the case after insert molding as marks of the locating pins 91 and 92, have openings on the lower side surface of the case.

As illustrated in FIG. 6A and FIG. 6B, the locating pins 91 in the Y1-Y2 direction (first direction) come into contact with the plate surface PS of the first extending portions 341. Accordingly, compared with the first embodiment in which the locating pins 91 come into contact with the side surfaces SS, the large areas of contact between the locating pins 91 in the Y1-Y2 direction (first direction) and the magnetic shield 30A can be provided. Therefore, in this embodiment, the locating accuracy of the magnetic shield 30A inside the mold can be higher than that in the first embodiment. It should be noted that the material member 301A0 that provides the metal plate 301A may have soft magnetic properties or may be composed of a material (for example, beryllium copper) having no soft magnetic properties for ease of fabrication.

After the magnetic shield 30A is appropriately located inside the mold, a molding resin is supplied (for example, by injection molding) into the mold to form the case 40 in which the magnetic shield 30A is insert-molded. Although the illustration is omitted to facilitate understanding, part of the busbar 10 is also disposed and located in the mold and insert-molded together with the magnetic shield 30A. Such components of the current sensor 100 integrated by insert molding enable highly-precise relative positioning of the components (specifically, the busbar 10 and the magnetic shield 30A) by one operation, increasing the measurement accuracy of the current sensor 100.

Accordingly, in this embodiment, the insert-molded component in which the magnetic shield 30A is embedded in the case 40 is formed by placing the component (magnetic shield 30A) to be embedded provided by punching the metal plate having the rustproofed plate surfaces PS inside the mold, which has the upper mold 81 and the lower mold 82, and supplying a resin material into the mold.

Here, the magnetic shield 30A, which is the embedded component, has the plate surfaces PS of the first extending portions 341 as first portions having the plate surfaces PS facing in the first direction (Y1-Y2 direction); the plate surfaces PS that are the outsides of the side wall portions 32 as second portions having the plate surfaces PS facing in the second direction (X1-X2 direction); and the plate surfaces PS of the bottom wall portion 33 as third portions having the plate surfaces PS facing in the third direction (Z1-Z2 direction). As described above, when the side wall portions 32 are defined as the second extending portions, in the embedded component (magnetic shield 30A), the first portions are provided to the first extending portions 341, the second portions are provided to the second extending portions (side wall portions 32), and the third portions are provided to the base 31, specifically, to the bottom wall portion 33.

In the mold, in a state in which the first portions to the third portions are in contact with the corresponding locating pins 91, 92, 931, and 932 for locating the embedded component, injection molding is performed. More specifically, the first portions are in contact with the locating pins 91, the second portions are in contact with the locating pins 92, and the third portions are in contact with the locating pins 931 and 932.

Third Embodiment

Figure 7:
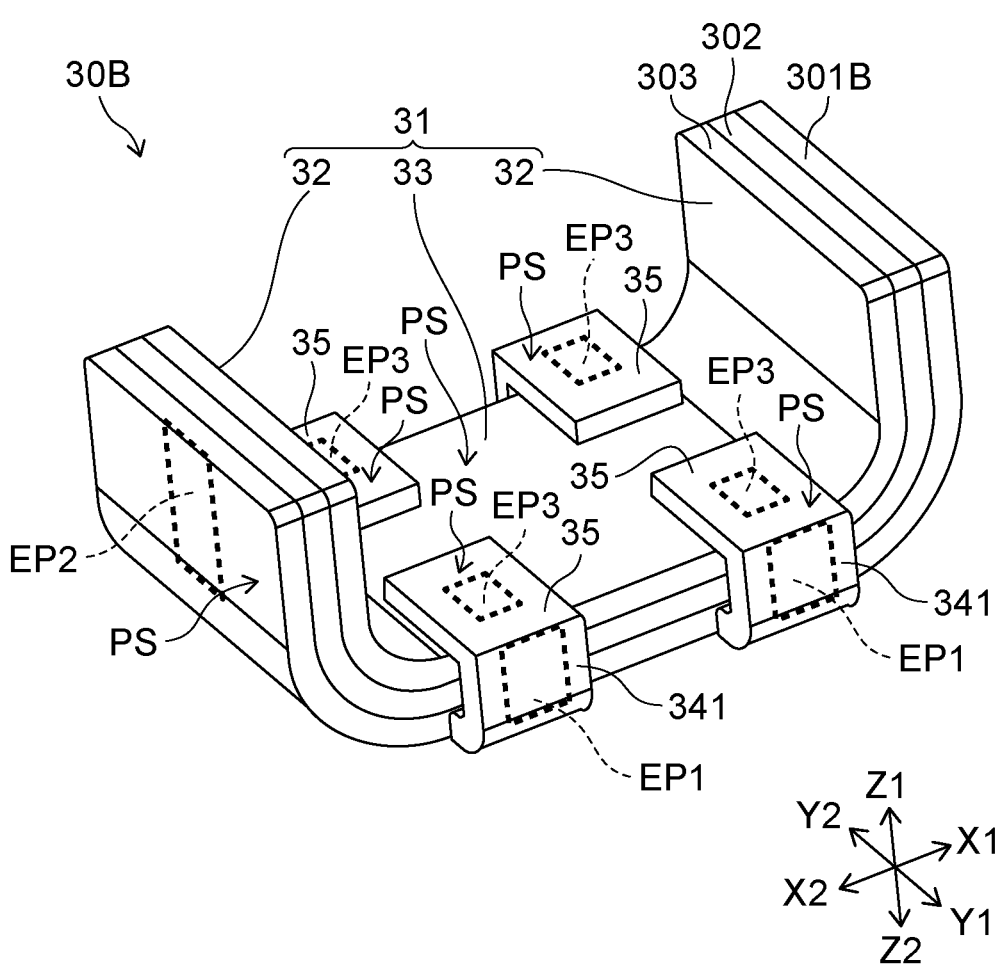
FIG. 7 illustrates a magnetic shield in a current sensor according to a third embodiment of the present invention.
Figures 8A, 8B:
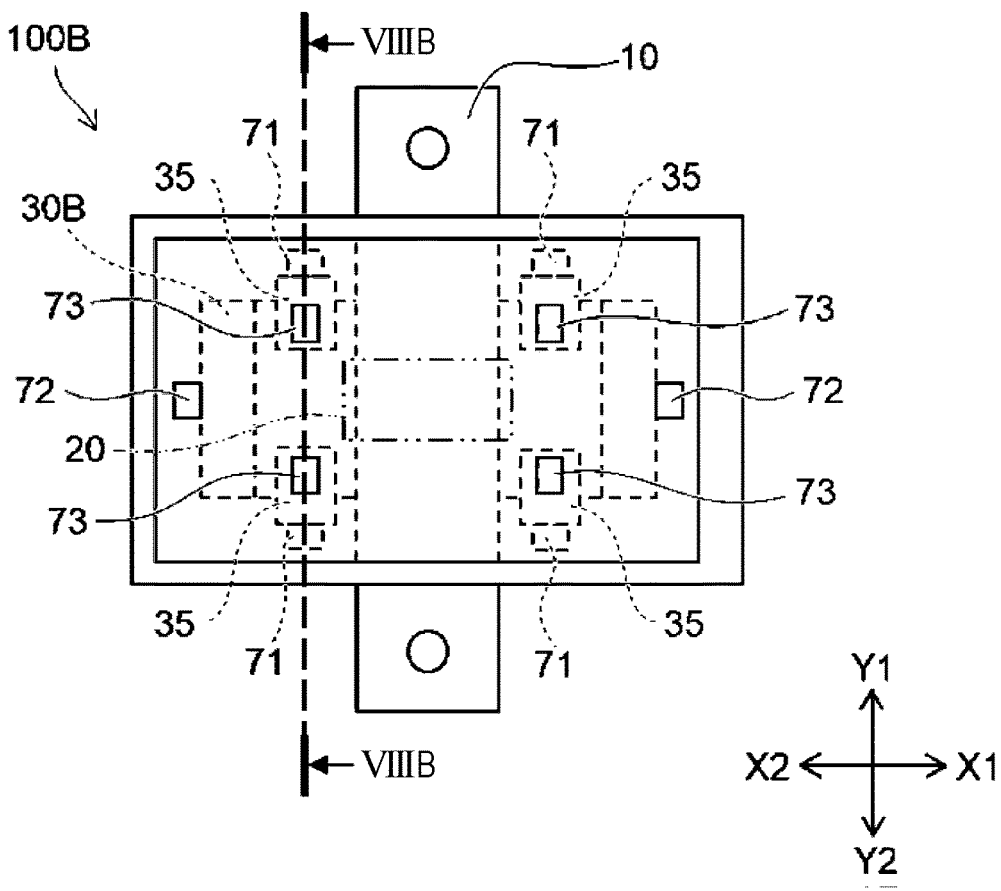
FIG. 8A illustrates the current sensor according to the third embodiment of the present invention.
FIG. 8B is a sectional view of the current sensor according to the third embodiment of the present invention taken along line VIIIB-VIIIB.

FIG. 7 illustrates a magnetic shield in a current sensor according to a third embodiment of the present invention. FIG. 8A illustrates the current sensor according to the third embodiment of the present invention. FIG. 8B is a sectional view of the current sensor according to the third embodiment of the present invention taken along line VIIIB-VIIIB.

Since the basic structure of a current sensor 100B according to the third embodiment of the present invention is similar to that of the current sensor 100A according to the second embodiment, only differences will be described and description of similar points will be omitted.

The current sensor 100B according to the third embodiment is different from the current sensor 100A according to the second embodiment in that a magnetic shield 30B has a different structure. More specifically, in the magnetic shield 30B, extended end portions in first extending portions 341 have bent extending portions 35 that are bent to face the plate surface PS of the base 31 (in this embodiment, the bottom wall portion 33).

With this structure, in this embodiment, different from the second embodiment, the third exposure portions EP3 are the plate surface PS of the bent extending portions 35. As described above, the plate surface PS is rustproofed and has rust-prevention properties, and thus a possibility of rusting in the third exposure portions EP3 can be reduced. In this embodiment, the plate surface PS of the metal plate 303 also has rust-prevention properties; however, for example, if the metal plate 301B of the bent extending portions 35 is composed of a material member that has higher rust-prevention properties than other metal plates, a possibility of rusting can be more stably reduced. In addition, caulking the multi-layered body in forming the bent extending portions 35 increases the structural stability of the magnetic shield 30B.

Fourth Embodiment

Figure 9:
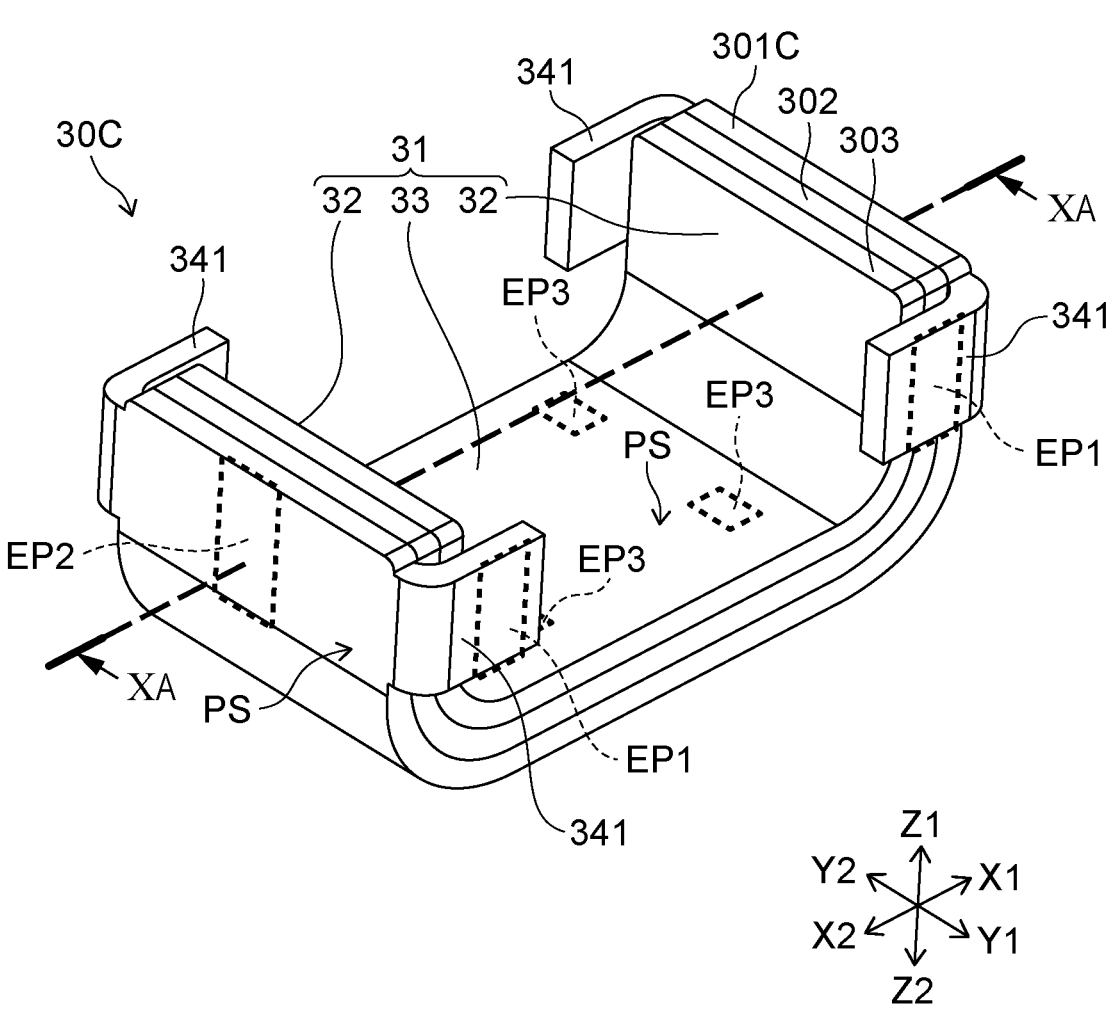
FIG. 9 illustrates a magnetic shield in a current sensor according to a fourth embodiment of the present invention.

FIG. 9 illustrates a magnetic shield in a current sensor according to a fourth embodiment of the present invention.

Since the basic structure of a current sensor 100C according to the fourth embodiment of the present invention is similar to that of the current sensor 100A according to the second embodiment, only differences will be described and description of similar points will be omitted.

The current sensor 100C according to the fourth embodiment is different from the current sensor 100A according to the second embodiment in that the positions of the first extending portions 341 are different because the shape of a metal plate 301C is different from the shape of the metal plate 301A. More specifically, the magnetic shield 30C includes first extending portions 341 provided to the side wall portions 32. The first extending portions 341 extend in the second direction (X1-X2 direction) among directions orthogonal to the first direction (Y1-Y2 direction) and have the plate surface PS each having its normal line extending in the first direction. With this structure in which the first extending portions 341 extend, the first extending portions 341 not only function as contact portions with the locating pins 91 but also have a function to reduce external magnetic fields and adjacent influence errors.

Figure 10A:
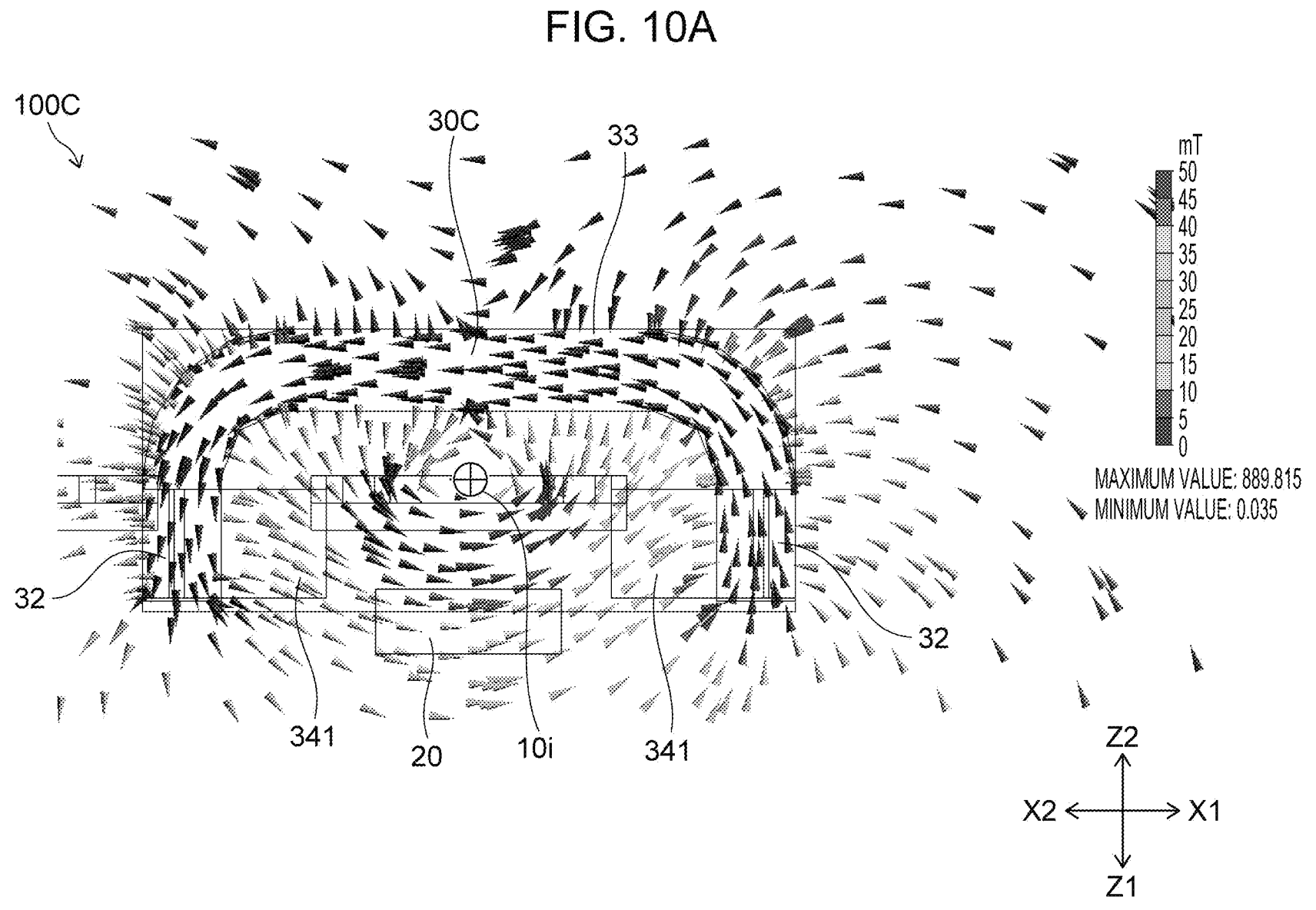
Figure 10B:
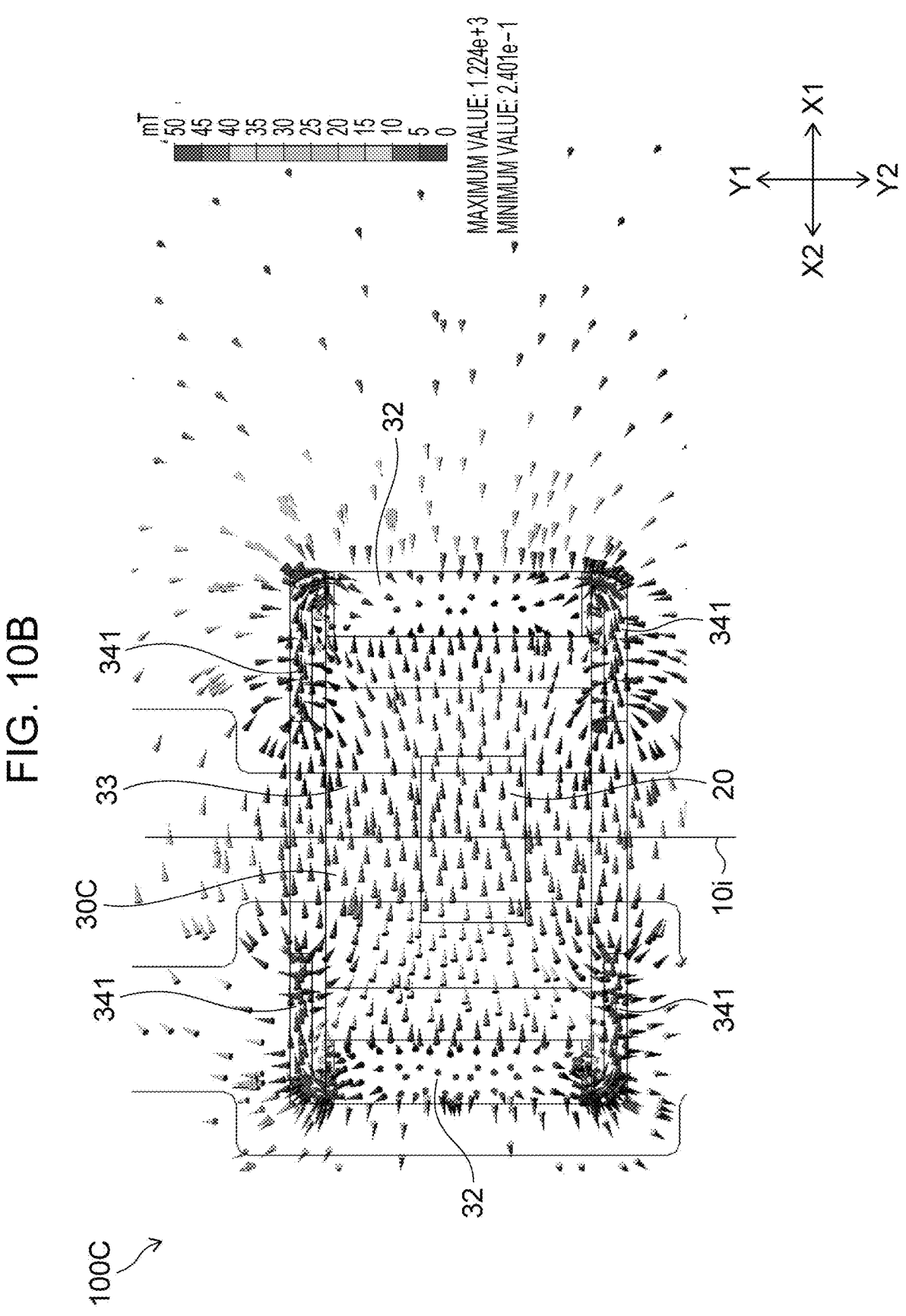
FIG. 10B is a view (top view) illustrating shielding effects of the magnetic shield in the current sensor according to the fourth embodiment of the present invention.

FIG. 10A is a sectional view taken along line XA-XA in FIG. 9 illustrating shielding effects of the magnetic shield in the current sensor according to the fourth embodiment of the present invention. FIG. 10B is a view illustrating shielding effects of the magnetic shield in the current sensor according to the fourth embodiment of the present invention and a view (top view) illustrating the current sensor 100 when viewed from the Z1 side in the Z1-Z2 direction. In FIG. 10B, for illustrative purposes, the board 50 and the cover 60 are not illustrated. In addition, in FIG. 10A and FIG. 10B, a current line 10i is illustrated instead of the busbar 10. In addition, in FIG. 10A and FIG. 10B, simulation results of the strengths and directions of an induced magnetic field due to the current flowing through the current line 10i are indicated by arrowhead-shaped marks.

Figure 11A:
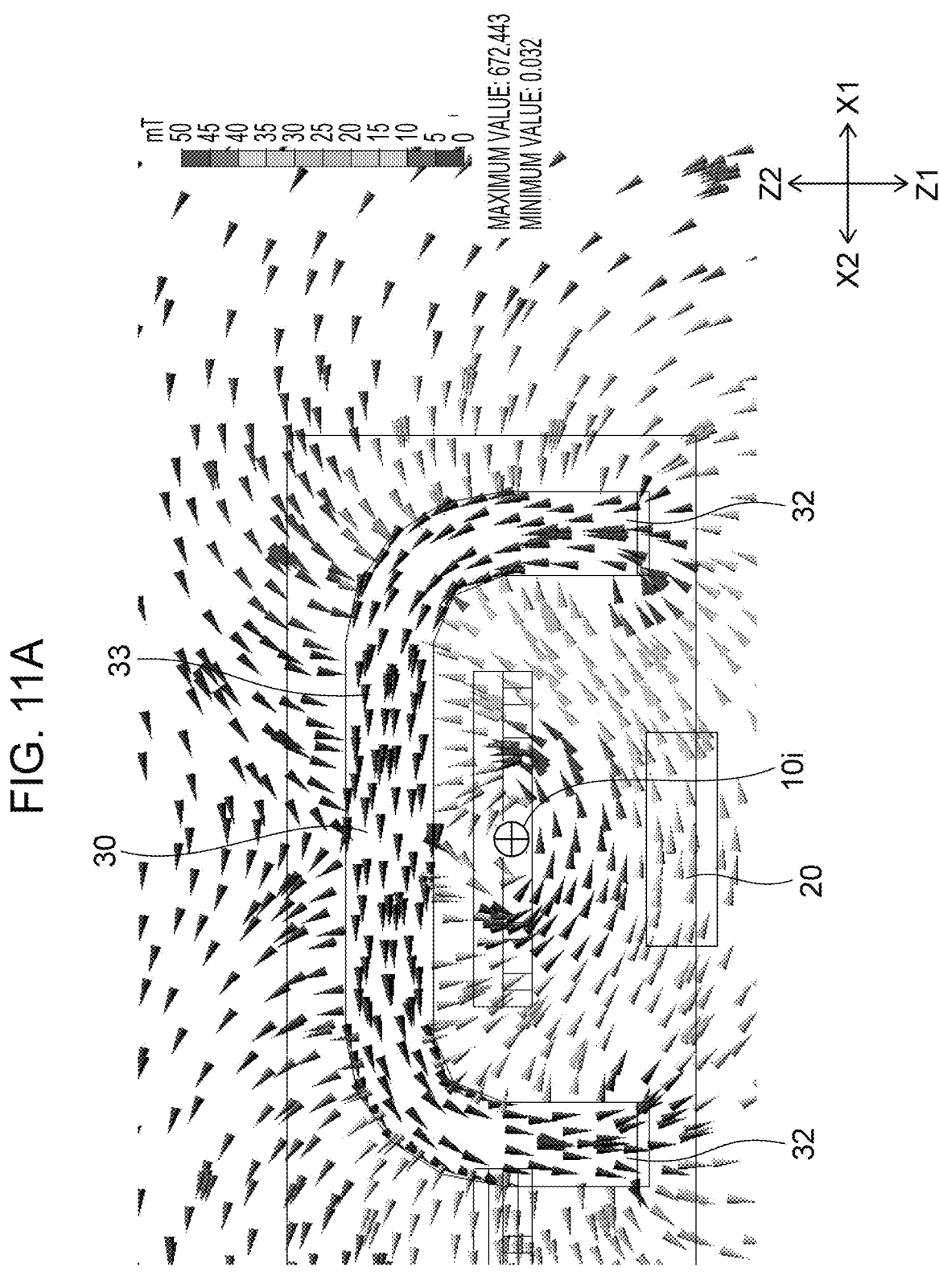
FIG. 11A is a view (sectional view) illustrating shielding effects of the magnetic shield in the current sensor according to the first embodiment of the present invention.
Figure 11B:
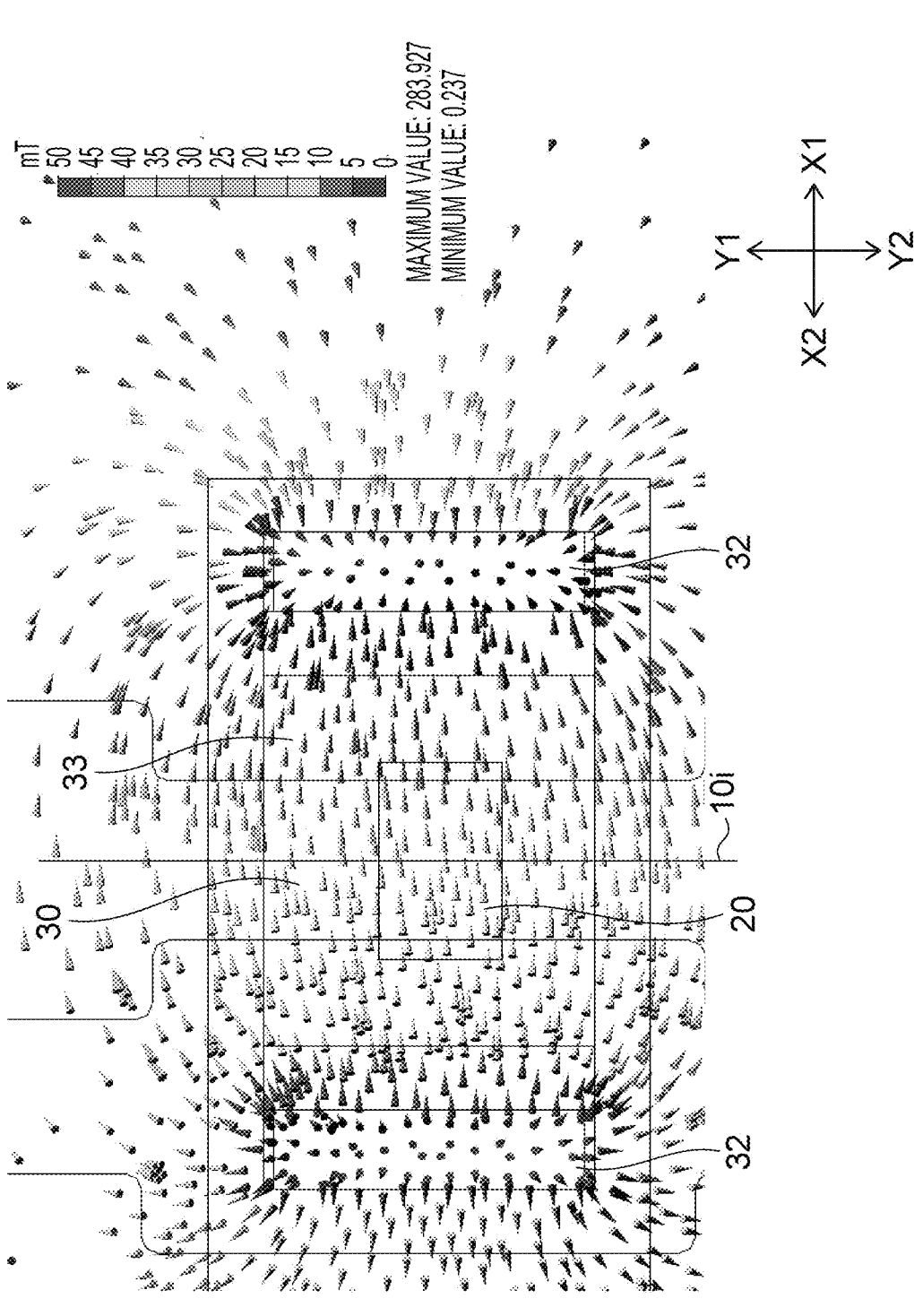
FIG. 11B is a view (top view) illustrating shielding effects of the magnetic shield in the current sensor according to the first embodiment of the present invention.

FIG. 11A is a view (sectional view) illustrating shielding effects of the magnetic shield in the current sensor according to the first embodiment of the present invention. FIG. 11B is a view (top view) illustrating shielding effects of the magnetic shield in the current sensor according to the first embodiment of the present invention. FIG. 11A and FIG. 11B are illustrated in contrast with FIG. 10A and FIG. 10B.

As illustrated in FIG. 10A and FIG. 11A, in both the first embodiment and the fourth embodiment, the induced magnetic fields generated by the currents flowing through the busbars 10 passed through the U-shaped magnetic shields (the magnetic shield 30C, the magnetic shield 30) and were released from the ends of the side wall portions 32, realizing efficient application of the magnetic fields to the magnetic sensors 20.

In particular, in the case of the fourth embodiment, as illustrated in FIG. 10B, the magnetic field preferentially flowed through the first extending portions 341, and thus the strong magnetic field was released not only from the side wall portion 32 but also from the first extending portions 341. In contrast, in the case of the first embodiment, as illustrated in FIG. 11B, the magnetic field was preferentially released only from the side wall portions 32. Accordingly, when the magnetic flux densities of the magnetic fields applied to the magnetic sensors 20 are compared, the fourth embodiment had a higher magnetic flux density than the first embodiment.

More specifically, in FIG. 11A illustrating the first embodiment, the magnetic field strength applied to the magnetic sensor 20 was 35 mT or less at most; however, in FIG. 10A illustrating the fourth embodiment, the magnetic field strength applied to the magnetic sensor 20 reached up to 45 mT at most. Accordingly, the application of the strong magnetic field from the busbar 10 located inside the magnetic shield 30C relatively reduced the effects of the external magnetic field, and thus the fourth embodiment has higher detection sensitivity than the first embodiment and is less susceptible to the external magnetic field. According to this simulation, the adjacent influence error in the structure in the first embodiment was 2.2%, whereas the adjacent influence error in the structure in the fourth embodiment was reduced to 1.6%.

Fifth Embodiment

Figure 12A:
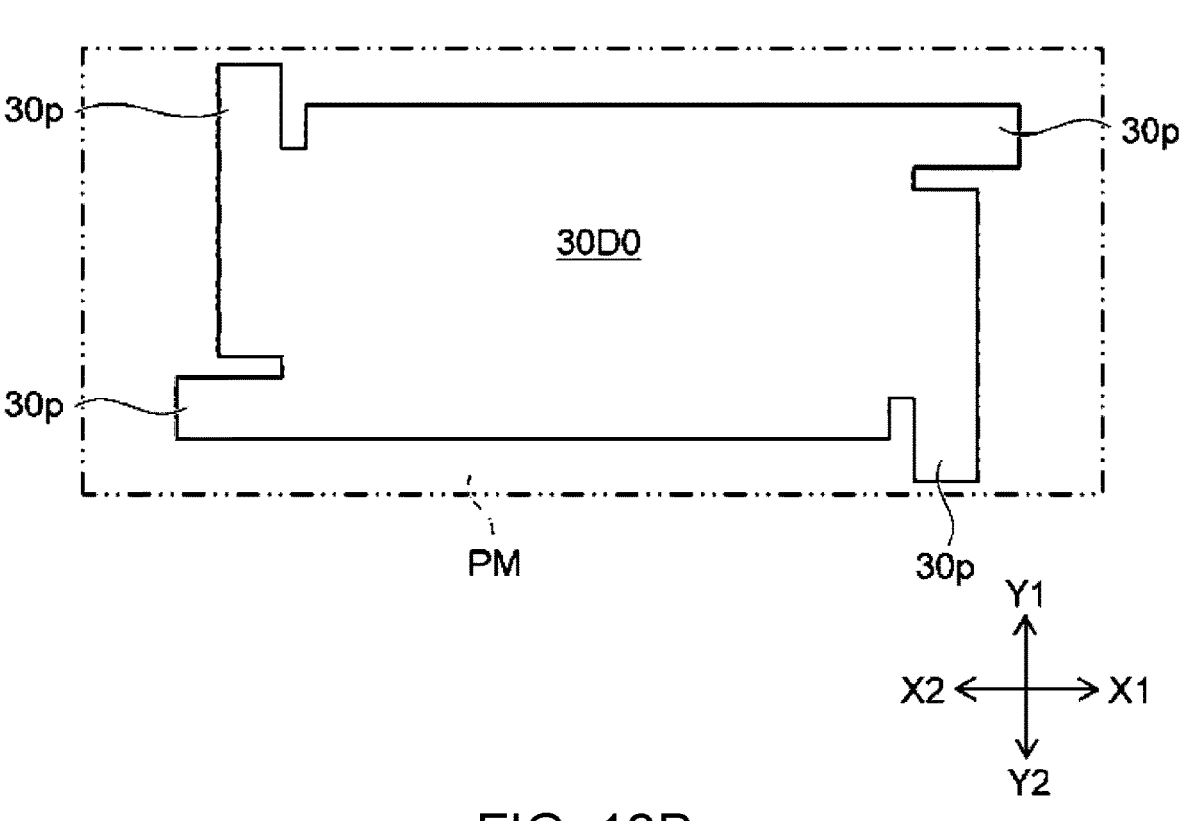
FIG. 12A illustrates a material member of a magnetic shield in a current sensor according to a fifth embodiment of the present invention.
Figure 12B:
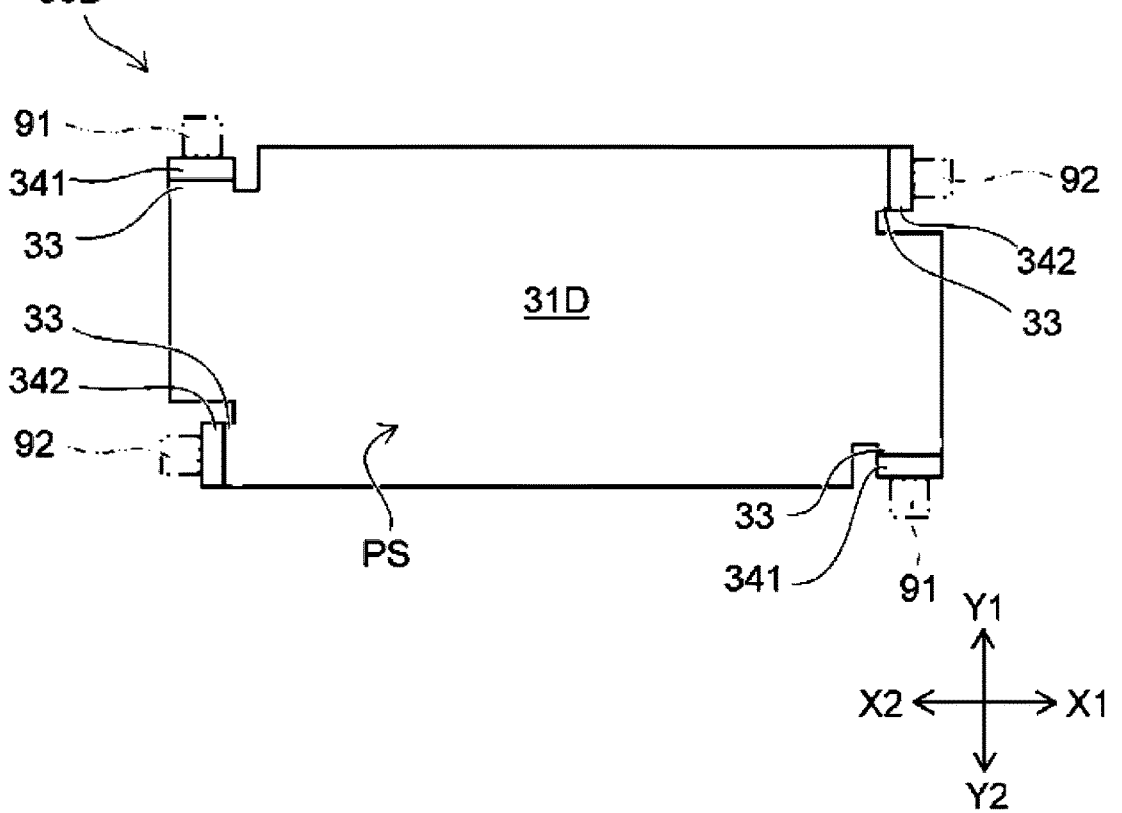
FIG. 12B is a top view illustrating the magnetic shield in the current sensor according to the fifth embodiment of the present invention.
Figure 12C:
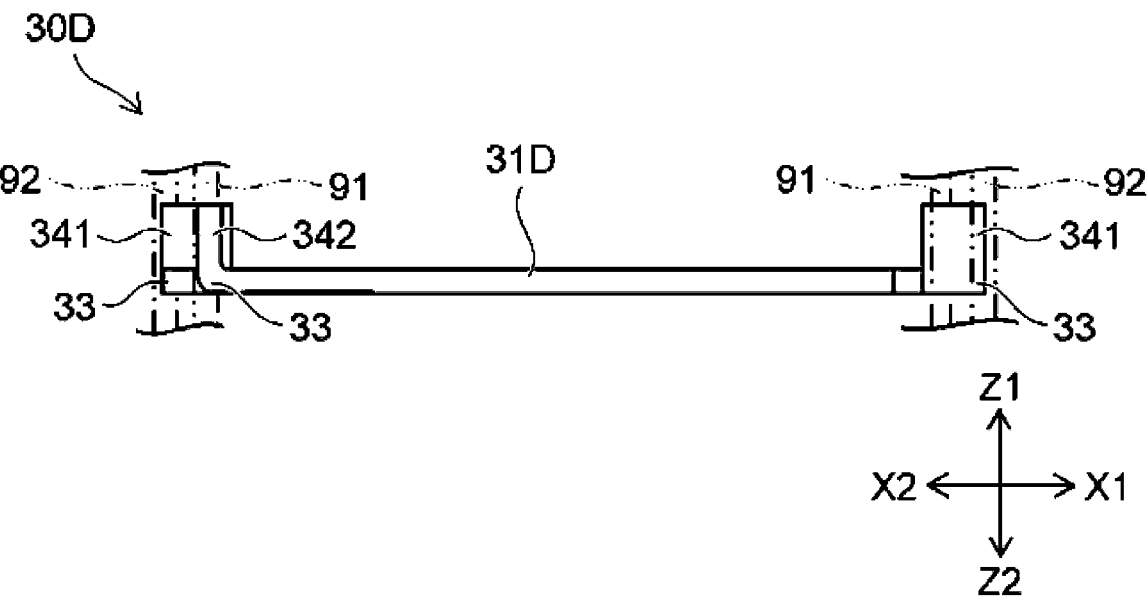
FIG. 12C is a side view illustrating the magnetic shield in the current sensor according to the fifth embodiment of the present invention.

FIG. 12A illustrates a material member of a magnetic shield in a current sensor according to a fifth embodiment of the present invention. FIG. 12B is a top view (a view from the Z1 side in the Z1-Z2 direction) illustrating the magnetic shield in the current sensor according to the fifth embodiment of the present invention. FIG. 12C is a side view (a view from the Y2 side in the Y1-Y2 direction) illustrating the magnetic shield in the current sensor according to the fifth embodiment of the present invention.

The current sensor according to the fifth embodiment of the present invention has a structure as illustrated in Japanese Unexamined Patent Application Publication No. 2021-36200, for example. A basic shape of a base 31D of a magnetic shield 30D is a plate-like shape and the magnetic shield 30D has first extending portions 341 and second extending portions 342 as in the second embodiment of the present invention.

The magnetic shield 30D is made of a material member 30D0 illustrated in FIG. 12A. The material member 30D0 can be obtained by, for example, punching a material metal plate PM. The material member 30D0 has protrusions 30p that extend in the X1-X2 direction (second direction) or the Y1-Y2 direction (first direction). By individually bending these protrusions 30p to the Z1 side in the Z1-Z2 direction, the magnetic shield 30D having the base 31D and the first extending portions 341 and the second extending portions 342 as illustrated in FIG. 12B and FIG. 12C can be obtained.

The magnetic shield 30D placed inside the mold for insert molding comes into contact with locating pins 91 in the Y1-Y2 direction (first direction) on plate surfaces PS of the first extending portions 341, and comes into contact with locating pins 92 in the X1-X2 direction (second direction) at the second extending portions 342. Although not illustrated, the magnetic shield 30D comes into contact with the Z1-Z2 direction (third direction) locating pins on the plate surfaces PS of the base 31D. As described above, the locating pins (the locating pins 91 and the locating pins 92) come into contact with the extending portions (the first extending portions 341 and the second extending portions 342), and thus the contact areas of the locating pins 91 and 92 and the magnetic shield 30D can be appropriately ensured regardless of the thickness of the metal plate, thereby increasing the accuracy in locating the magnetic shield 30D inside the mold. Accordingly, in this embodiment, not only problems due to rusting can be prevented but also the measurement accuracy of the current sensor can be increased.

It should be noted that the above-described embodiments are provided to facilitate understanding of the present invention and do not limit the present invention. Accordingly, the components disclosed in these embodiments are intended to include all design changes and equivalents that fall within the technical scope of the present invention.

For example, in the embodiment, the bent extending portions 35 are bent to face the plate surface PS of the metal plate 303, which is different from the metal plate 301B having the bent extending portions 35; however, the bent extending portions 35 are not limited to this example, and the bent extending portions 35 may be bent to face the plate surface PS of the metal plate 301B having the bent extending portions 35. In addition, the positions at which the bent extending portions 35 are provided are not limited. The bent extending portions 35 may be provided at any of the first portions, the second portions, and the third portions of the embedded component (magnetic shield), or may be provided at different portions.

What is claimed is:

1. A current sensor comprising:
   a busbar extending in a first direction perpendicular to a second direction;
   a magnetic sensor disposed on one side of the busbar in a third direction perpendicular to the first direction and the second direction so as to face the busbar;
   a magnetic shield formed of a bent metal plate having a base plate portion disposed on another side of the busbar opposite to the one side in the third direction so as to face the busbar, the bent metal plate having:
      plate surfaces having a normal line in a thickness direction of the bent metal plate and provided with rust-prevention properties; and
      side surfaces having a normal line in a direction perpendicular to the thickness direction and provided with no rust-prevention properties; and
   a case accommodating the busbar, the magnetic sensor, and the magnetic shield therein, the case including an insert-molded section in which at least a part of the magnetic shield is insert-molded, the insert-molded section having a plurality of holes in which some surfaces of the magnetic shield are exposed as exposed areas, the plurality of holes including:
      first holes exposing first areas of the plate surfaces facing the first direction;
      second holes exposing second areas of the plate surfaces facing the second direction; and
      third holes exposing third areas of the plate surfaces facing the third direction,
   wherein the base plate portion has;
      a base plate surface having a normal line in the third direction; and at least one of:
         a first side surface having a normal line in the first direction; and
         a second side surface having a normal line in the second direction,
   wherein the magnetic shield further comprises:
      first extending portions each extending in the thickness direction of the bent metal plate from ends of the bent metal plate in the first direction, each first extending portion having a first plate surface having a normal line in the first direction; and
      second extending portions each extending in the third direction from ends of the base plate portion in the second direction and having a second plate surface having a normal line in the second direction,
   wherein the first areas are portions of the first plate surface, and the second areas are portions of the second plate surface, and wherein at least one of the ends of the bent metal plate in the first direction and the ends of the base plate portion in the second direction include:

portions forming the side surfaces; and portions from which the first or the second extending portions extend to form the first or the second plate surface.

2. The current sensor according to claim 1, wherein the plurality of holes are marks of locating pins for insert-molding the magnetic shield with the insert-molded portion.

3. The current sensor according to claim 1, wherein at least the base plate portion of the magnetic shield comprises a plurality of metal layers, at least one of which has at least one of the first extending portions and the second extending portions.

4. The current sensor according to claim 3, wherein an outermost metal layer of the plurality of metal layers has at least one of the first extending portions and the second extending portions, such that the first extending portions or the second extending portions extend in the thickness direction of the bent metal plate.

5. The current sensor according to claim 1, wherein at least one of the first extending portions and the second extending portions have respective bent extending portions bent over to face the base plate surface.

6. The current sensor according to claim 5, wherein the bent extending portions have a third plate surface provided with the rust-prevention properties, and wherein the third areas are portions of the third plate surfaces.

7. The current sensor according to claim 1, wherein the bent metal plate includes a pair of wall plate portions extending in the third direction continuously from the ends of the base plate portion in the second direction so as to form the second extending portions of the magnetic shield.

8. The current sensor according to claim 7, wherein the first extending portions extend in the thickness direction of the bent metal plate from ends of the wall plate portions in the first direction, the thickness direction of the bent metal plate at the ends of the wall plate portions being the second direction.

9. The current sensor according to claim 1, wherein the second extending portions are bent portions extending in the third direction continuously from the ends of the base plate portion in the second direction such that the second extending portions face each other in the second direction with the magnetic sensor is disposed therebetween viewed from the third direction.

10. The current sensor according to claim 1, wherein the third areas are portions of the base plate surface.

11. A method of manufacturing an insert-molded component by insert-molding a bent metal plate, the method comprising:

providing a mold having a plurality of locating pins including:

first locating pins for positioning in a first direction;

second locating pins for positioning in a second direction orthogonal to the first direction; and third locating pins for positioning in a third direction orthogonal to the first direction and the second direction;

providing the bent metal plate including a base plate portion, the bent metal plate having:

plate surfaces having a normal line in a thickness direction of the bent metal plate and provided with rust-prevention properties, including a base plate surface base plate portion having the normal line in the third direction;

side surfaces having a normal line in a direction perpendicular to the thickness direction and provided with no rust-prevention properties;

first extending portions each extending in the thickness direction of the bent metal plate from ends of the bent metal plate in the first direction, each first extending portion having a first plate surface having a normal line in the first direction; and second extending portions each extending in the third direction from ends of the base plate portion in the second direction and having a second plate surface having a normal line in the second direction, wherein at least one of the ends of the bent metal plate in the first direction and the ends of the base plate portion in the second direction include:

portions forming the side surfaces; and portions from which the first or the second extending portions extend to from the first or second plate surface;

placing the bent metal plate in the mold in such a state that the first locating pins and the second locating pins are in contact with the first plate and the second plate surface, respectively; and performing injection molding by supplying a molding resin into the mold in which the bent metal is positioned.

12. The method according to claim 11, wherein at least one of the first extending portions and the second extending portions have respective bent extending portions bent over to face the base plate surface, the bent extending portions having a third plate surface provided with the rust-prevention properties, and wherein placing the bent metal plate in the mold includes making the third locating pins in contact with the third plate surface.

13. The current sensor according to claim 1, wherein the portions forming the side surfaces and the portions from which the first or the second extending portions extend are adjacent to each other in the second direction or the first direction, respectively, in at least one of the ends of the base plate portion in the first direction and the ends of the base plate portion in the second direction.

14. The method according to claim 11, wherein the portions forming the side surfaces and the portions from which the first or the second extending portions extend are adjacent to each other in the second direction or the first direction, respectively, in at least one of the ends of the base plate portion in the first direction and the ends of the base plate portion in the second direction.

15. The method according to claim 11, wherein the placing the bent metal plate in the mold includes making the third locating pins in contact with the base plate surface.

* * * * *